US008062949B2

(12) United States Patent
Forbes (10) Patent No.: US 8,062,949 B2
(45) Date of Patent: Nov. 22, 2011

(54) NANOWIRE TRANSISTOR WITH SURROUNDING GATE (75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 525 days.

(21) Appl. No.: 12/198,265

(22) Filed: Aug. 26, 2008

(65) Prior Publication Data
US 2010/0330759 A1    Dec. 30, 2010

Related U.S. Application Data (63) Continuation of application No. 11/397,527, filed on Apr. 4, 2006, now Pat. No. 7,425,491.

(51) Int. Cl.
*H01L 21/336* (2006.01)
(52) U.S. Cl. .......... 438/301; 438/96; 438/365; 438/482; 257/E33.004; 257/E31.001
(58) Field of Classification Search .................. 438/269, 438/301, 486; 257/E21.41, E21.09
See application file for complete search history.

(56) References Cited

U.S. PATENT DOCUMENTS

| 4,941,026 A | 7/1990 | Temple |
| 5,013,680 A | 5/1991 | Lowrey et al. |
| 5,646,900 A | 7/1997 | Tsukude et al. |
| 5,909,618 A | 6/1999 | Forbes et al. |
| 5,982,162 A | 11/1999 | Yamauchi |
| 6,097,065 A | 8/2000 | Forbes et al. |
| 6,104,061 A | 8/2000 | Forbes et al. |
| 6,104,068 A | 8/2000 | Forbes |
| 6,150,687 A | 11/2000 | Noble et al. |
| 6,177,299 B1 | 1/2001 | Hsu et al. |
| 6,191,448 B1 | 2/2001 | Forbes et al. |
| 6,238,976 B1 | 5/2001 | Noble et al. |
| 6,320,222 B1 | 11/2001 | Forbes et al. |
| 6,350,635 B1 | 2/2002 | Noble et al. |
| 6,355,961 B1 | 3/2002 | Forbes |
| 6,376,317 B1 | 4/2002 | Forbes et al. |
| 6,377,070 B1 | 4/2002 | Forbes |

(Continued)

FOREIGN PATENT DOCUMENTS

DE    19943390 A1    5/2001

(Continued)

OTHER PUBLICATIONS

"Chinese Application No. 200780011084.7, Amendment filed Jan. 16, 2011", (with English translation of amended claims), 13 pgs.

(Continued)

*Primary Examiner* — Walter L Lindsay, Jr.
*Assistant Examiner* — Abdulfattah Mustapha
(74) *Attorney, Agent, or Firm* — Schwegman, Lundberg & Woessner, P.A.

(57) ABSTRACT

One aspect of the present subject matter relates to a method for forming a transistor. According to an embodiment of the method, a pillar of amorphous semiconductor material is formed on a crystalline substrate, and a solid phase epitaxy process is performed to crystallize the amorphous semiconductor material using the crystalline substrate to seed the crystalline growth. The pillar has a sublithographic thickness. A transistor body is formed in the crystallized semiconductor pillar between a first source/drain region and a second source/drain region. A surrounding gate insulator is formed around the semiconductor pillar, and a surrounding gate is formed around and separated from the semiconductor pillar by the surrounding gate insulator. Other aspects are provided herein.

25 Claims, 12 Drawing Sheets

U.S. PATENT DOCUMENTS

| | | | |
|---|---|---|---|
| 6,399,979 B1 | 6/2002 | Noble et al. | |
| 6,413,802 B1* | 7/2002 | Hu et al. | 438/151 |
| 6,413,825 B1 | 7/2002 | Forbes | |
| 6,414,356 B1 | 7/2002 | Forbes et al. | |
| 6,424,001 B1 | 7/2002 | Forbes et al. | |
| 6,448,601 B1 | 9/2002 | Forbes et al. | |
| 6,492,233 B2 | 12/2002 | Forbes et al. | |
| 6,496,034 B2 | 12/2002 | Forbes et al. | |
| 6,504,201 B1 | 1/2003 | Noble et al. | |
| 6,531,727 B2 | 3/2003 | Forbes et al. | |
| 6,559,491 B2 | 5/2003 | Forbes et al. | |
| 6,566,682 B2 | 5/2003 | Forbes | |
| 6,639,268 B2 | 10/2003 | Forbes et al. | |
| 6,649,476 B2 | 11/2003 | Forbes | |
| 6,653,174 B1 | 11/2003 | Cho et al. | |
| 6,664,806 B2 | 12/2003 | Forbes et al. | |
| 6,720,216 B2 | 4/2004 | Forbes | |
| 6,747,313 B1 | 6/2004 | Gil | |
| 6,762,448 B1 | 7/2004 | Lin et al. | |
| 6,801,056 B2 | 10/2004 | Forbes | |
| 6,818,937 B2 | 11/2004 | Noble et al. | |
| 6,855,582 B1 | 2/2005 | Dakshina-Murthy et al. | |
| 6,881,627 B2 | 4/2005 | Forbes et al. | |
| 6,890,812 B2 | 5/2005 | Forbes et al. | |
| 6,894,532 B2 | 5/2005 | Forbes et al. | |
| 6,903,367 B2 | 6/2005 | Forbes | |
| 6,946,879 B2 | 9/2005 | Forbes | |
| 6,964,903 B2 | 11/2005 | Forbes | |
| 7,120,046 B1 | 10/2006 | Forbes | |
| 7,326,611 B2 | 2/2008 | Forbes | |
| 7,371,627 B1 | 5/2008 | Forbes | |
| 7,425,491 B2 | 9/2008 | Forbes et al. | |
| 7,439,576 B2 | 10/2008 | Forbes | |
| 7,446,372 B2 | 11/2008 | Forbes | |
| 7,491,995 B2 | 2/2009 | Forbes | |
| 2002/0028541 A1 | 3/2002 | Lee et al. | |
| 2002/0060338 A1 | 5/2002 | Zhang | |
| 2002/0177265 A1 | 11/2002 | Skotnicki | |
| 2003/0008515 A1 | 1/2003 | Chen et al. | |
| 2003/0227072 A1 | 12/2003 | Forbes | |
| 2004/0007721 A1 | 1/2004 | Forbes et al. | |
| 2004/0108545 A1 | 6/2004 | Ando | |
| 2004/0174734 A1 | 9/2004 | Forbes | |
| 2004/0217391 A1 | 11/2004 | Forbes | |
| 2004/0219722 A1 | 11/2004 | Pham et al. | |
| 2004/0235243 A1 | 11/2004 | Noble et al. | |
| 2005/0023616 A1 | 2/2005 | Forbes | |
| 2005/0032297 A1 | 2/2005 | Kamins | |
| 2005/0190617 A1 | 9/2005 | Forbes et al. | |
| 2006/0043471 A1 | 3/2006 | Tang et al. | |
| 2006/0046200 A1 | 3/2006 | Abatchev et al. | |
| 2006/0046391 A1 | 3/2006 | Tang et al. | |
| 2006/0046424 A1 | 3/2006 | Chance et al. | |
| 2006/0076625 A1 | 4/2006 | Lee et al. | |
| 2006/0258119 A1 | 11/2006 | Wells | |
| 2006/0278910 A1 | 12/2006 | Forbes | |
| 2007/0018206 A1 | 1/2007 | Forbes | |
| 2007/0052012 A1 | 3/2007 | Forbes | |
| 2007/0082448 A1* | 4/2007 | Kim et al. | 438/268 |
| 2007/0228433 A1 | 10/2007 | Forbes | |
| 2007/0228491 A1 | 10/2007 | Forbes | |
| 2007/0231980 A1 | 10/2007 | Forbes | |
| 2007/0231985 A1 | 10/2007 | Forbes | |
| 2007/0232007 A1 | 10/2007 | Forbes | |
| 2008/0315279 A1 | 12/2008 | Forbes | |

FOREIGN PATENT DOCUMENTS

| | | |
|---|---|---|
| WO | WO-2005079182 A2 | 9/2005 |
| WO | WO-2005079182 A3 | 9/2005 |
| WO | WO-2007114927 A1 | 10/2007 |
| WO | WO-2007120492 A1 | 10/2007 |
| WO | WO-2007120493 A1 | 10/2007 |
| WO | WO-2007136461 A2 | 11/2007 |
| WO | WO-2007136461 A3 | 11/2007 |

OTHER PUBLICATIONS

"Chinese Application Serial No. 200780011164.2, Amendment filed Jan. 17, 2010", (with English translation of amended claims), 16 pgs.

"Chinese Application Serial No. 200780012174.8, Office Action mailed Dec. 3, 2010", with English translation, 5 pgs.

"Chinese Application Serial No. 200780012174.8, Office Action response filed Jan. 28, 2011", (with English translation of amended claims), 12 pgs.

"Chinese Application Serial No. 200780012174.8, Response filed Feb. 10, 2011", (with English translation of amended claims), 13 pgs.

"European Application Serial No. 07754621.6, Examination Notification Art. 94(3) mailed Feb. 4, 2011", 5 pgs.

"European Application Serial No. 07754850.1, Office Action Response mailed Nov. 17, 2010", 19 pgs.

"European Application Serial No. 07809002.4, Examination Notification Art. 94(3) mailed Feb. 4, 2011", 5 pgs.

"Japanese Application Serial No. 2009-504232, Amendment filed Mar. 31, 2010", (with English translation of amended claims), 16 pgs.

"Japanese Application Serial No. 2009-504238, Voluntary Amendment filed Mar. 24, 2010", (with English translation of amended claims), 17 pgs.

"Japanese Application Serial No. 2009-504280, Amendment filed Mar. 31, 2010", with English translation, 15 pgs.

"Taiwan Application Serial No. 096112121, Office Action mailed Dec. 24, 2010", English translation, 7 pgs.

"Taiwan Application Serial No. 96112122, Office Action Response filed Jan. 6, 2011", with English translation of claims and abstract, 36 pgs.

"Taiwan Application Serial No. 96112125, Office Action mailed Dec. 2, 2010", with English translation of claims, 15 pgs.

"Chinese Application Serial No. 200780012174.8, Office Action mailed Mar. 30, 2011", Notification letter, 4 pgs.

"Taiwan Application Serial No. 096112121, Office Action Filed Apr. 7, 2011", Notification letter, 2 pgs.

"Taiwan Application Serial No. 96112122, Notice of Allowance Mar. 8, 2011", Notification letter, 2 pgs.

Adler, E., et al., "The Evolution of IBM CMOS DRAM Technology", *IBM Journal of Research & Development*, 39(1-2), (Jan.-Mar. 1995), 167-188.

Bryllert, Tomas, et al., "Vertical high mobility wrap-gated InAs nanowire transistor", *IEEE Device Research Conference*, Santa Barbara, CA, (Jun. 2005), 157-158.

Cho, Hyun-Jin, et al., "A Novel Pillar DRAM Cell for 4Gbit and Beyond", *1998 Symposium on VLSI Technology Digest of Technical Papers*, Jun. 9-11, 1998, (Jun. 1998), 38-39.

Denton, Jack P., et al., "Fully depleted dual-gated thin-film SOI P-MOSFETs fabricated in SOI islands with an isolated buried polysilicon backgate", *IEEE Electron Device Letters*, 17(11), (Nov. 1996), 509-511.

Doyle, B. S., et al., "High performance fully-depleted tri-gate CMOS transistors", *IEEE Electron Device Letters*, vol. 24, No. 4, (Apr. 2003), 263-265.

Doyle, B. S., et al., "Tri-Gate fully-depleted CMIS transistors: fabrication, design and layout", *2003 Symposium on VLSI Technology Digest of Technical Papers*, Kyoto, Japan, Jun.10-12, 2003, 133-134.

Huang, Xuejue, et al., "Sub-50 nm P-Channel FinFET", *IEEE Transactions on Electron Devices*, vol. 48, No. 5, (May 2001), 880-886.

Kalavade, Pranav, et al., "A novel sub-10 nm transistor", *58th DRC. Device Research Conference. Conference Digest*, (Jun. 19-21, 2000), 71-72.

Kedzierski, Jakub, et al., "Threshold voltage control in NiSi-gated MOSFETs through silicidation induced impurity segregation (SIIS)", *IEDM Tech. Dig.*, (2003), 315-318.

Kim, Keunwoo, et al., "Nanoscale CMOS Circuit Leakage Power Reduction by Double-Gate Device", *International Symposium on Low Power Electronics and Design*, Newport, CA, Aug. 9-11, 2004; http://www.islped.org, (2004), 102-107.

Lee, Choonsup, et al., "A Nanochannel Fabrication Technique without Nanolithography", *Nano Letters*, vol. 3, No. 10, (2003), 1339-1340.

Miyano, Shinji, et al., "Numerical Analysis of a Cylindrical Thin-Pillar Transistor (CYNTHIA)", *IEEE Transactions on Electron Devices*, vol. 39, No. 8, (Aug. 1992), 1876-1881.

Nirschl, Th., et al., "The Tunneling Field Effect Transistor (TFET) as an Add-on for Ultra-Low-Voltage Analog and Digital Processes",

*IEEE International Electron Devices Meeting, 2004; IEDM Technical Digest*, (Dec. 13-15, 2004), 195-198.

Rahman, Anisur, et al., "Theory of Ballistic Nanotransistors", *IEEE Transactions on Electron Devices*, vol. 50, No. 9, (Sep. 2003), 1853-1864.

Samuelson, L., et al., "Semiconductor nanowires for 0D and 1D physics and applications", *Physica E 25*, (Jul. 27, 2004), 313-318.

Samuelson, Lars, "Semiconductor Nanowires as a Novel Electronic Materials Technology for Future Electronic Devices", *IEEE Device Research Conference*, Santa Barbara, CA, (Jun. 2005), 245.

Shimomura, K., et al., "A 1-V 46-ns 16-Mb SOI-DRAM with body control technique", *IEEE Journal of Solid-State Circuits*, 32(11), (Nov. 1997), 1712-1720.

Shimomura, K., et al., "A 1V 46ns 16Mb SOI-DRAM with Body Control Technique", *1997 IEEE International Solid-State Circuits Conference, Digest of Technical Papers*, (Feb. 6, 1997), 68-69.

Takato, H., et al., "High Performance CMOS Surrounding Gate Transistor (SGT) for Ultra High Density LSIs", *IEEE International Electron Devices Meeting, Technical Digest*, (1988), 222-225.

Wong, Hon-Sum Philip, et al., "Self-Aligned (Top and Bottom) Double-Gate MOSFET with a 25 nm Thick Silicon Channel", *IEEE Int. Electron Device Meeting*, (1997), 427-430.

Xuan, Peiqi, et al., "60nm Planarized Ultra-thin Body Solid Phase Epitaxy MOSFETs", *IEEE Device Research Conference, Conference Digest. 58th DRC*, (Jun. 19-21, 2000), 67-68.

Ziegler, James F., et al., "Cosmic Ray Soft Error Rates of 16-Mb DRAM Memory Chips", *IEEE Journal of Solid-State Circuits*, vol. 33, No. 2, (Feb. 1998), 246-252.

"U.S. Appl. No. 11/397,358, Final Office Action mailed Nov. 10, 2010", 11 pgs.

"U.S. Appl. No. 11/397,358, Non-Final Office Action mailed May 24, 2010", 14 pgs.

"U.S. Appl. No. 11/397,358, Response filed Aug. 24, 2010 to Non Final Office Action mailed Jun. 24, 2010", 13 pgs.

"U.S. Appl. No. 11/397,413, Response filed May 12, 2008 to Non Final Office Action mailed Feb. 11, 2008", 11 pgs.

"U.S. Appl. No. 11/397,430, Advisory Action mailed May 19, 2010", 3 pgs.

"U.S. Appl. No. 12/192,618, Notice of Allowance mailed Jun. 24, 2010", 9 pgs.

"U.S. Appl. No. 12/192,618, Response filed May 10, 2010 to Final Office Action mailed Mar. 8, 2010", 13 pgs.

"U.S. Appl. No. 12/353,592, Final Office Action mailed Oct. 18, 2010", 14 pgs.

"U.S. Appl. No. 12/353,592, Non-Final Office Action mailed Apr. 29, 2010", 14 pgs.

"U.S. Appl. No. 12/353,592, Response filed Jul. 27, 2010 to Non Final Office Action mailed Apr. 29, 2010", 10 pgs.

"Chinese Application Serial No. 200780011084.7, Office Action mailed Sep. 26, 2010", 3 Pgs.

"European Application Serial No. 07754850.1, Office Action Mailed May 25, 2010", 6 pgs.

"Taiwan Application Serial No. 96112122, Office Action mailed Sep. 17, 2010", 53 pgs.

"Chinese Application No. 200780011164.2, Office Action issued Oct. 23, 2009", 5 pgs.

Mitsutoshi, et al., "Excimer laser annealing of amorphous and solid-phase-crystallized silicon films.", *Journal of Applied Physics*, vol. 86, No. 10, (Nov. 15, 1999.), 10 pgs.

* cited by examiner

NANOWIRE TRANSISTOR WITH SURROUNDING GATE

CROSS REFERENCE TO RELATED APPLICATIONS

This application is a Continuation of U.S. application Ser. No. 11/397,527, filed Apr. 4, 2006 now U.S. Pat. No. 7,425,491, which is incorporated herein by reference in its entirety.

This application is related to the following commonly assigned U.S. patent applications which are filed on even date herewith and are herein incorporated by reference in their entirety: "Grown Nanofin Transistors," U.S. application Ser. No. 11/397,430, filed on Apr. 4, 2006; "Etched Nanofin Transistors," U.S. application Ser. No. 11/397,358, filed on Apr. 4, 2006; "DRAM With Nanofin Transistors," U.S. application Ser. No. 11/397,413, filed on Apr. 4, 2006; and "Tunneling Transistor With Sublithographic Channel," U.S. application Ser. No. 11/397,406, filed on Apr. 4, 2006.

TECHNICAL FIELD

This disclosure relates generally to semiconductor devices, and more particularly, to nanowire transistors that have a surrounding gate.

BACKGROUND

Figure 1:
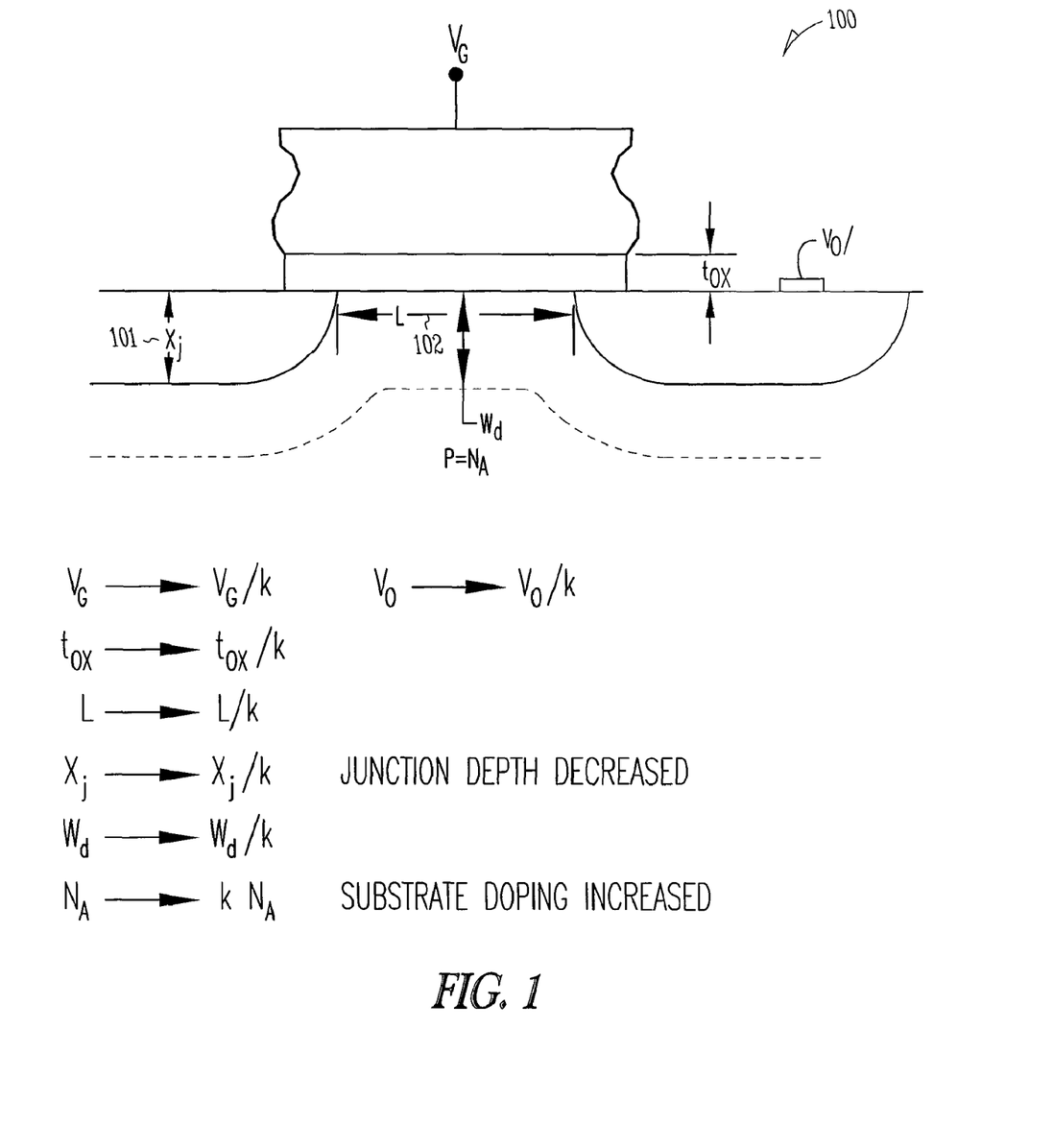
FIG. 1 illustrates general trends and relationships for a variety of device parameters with scaling by a factor k.

The semiconductor industry has a market driven need to reduce the size of devices, such as transistors, and increase the device density on a substrate. Some product goals include lower power consumption, higher performance, and smaller sizes. FIG. 1 illustrates general trends and relationships for a variety of device parameters with scaling by a factor k. The continuous scaling of MOSFET technology to the deep sub-micron region where channel lengths are less than 0.1 micron (100 nm or 1000 Å) causes significant problems in the conventional transistor structures. For example, junction depths should be much less than the channel length. Thus, with reference to the transistor 100 illustrated in FIG. 1, the junctions depths 101 should be on the order of a few hundred Angstroms for channels lengths 102 that are approximately 1000 Å long. Such shallow junctions are difficult to form by conventional implantation and diffusion techniques. Extremely high levels of channel doping are required to suppress short-channel effects such as drain induced barrier lowering, threshold voltage roll off, and sub-threshold conduction. Sub-threshold conduction is particularly problematic in DRAM technology as it reduces the charge storage retention time on the capacitor cells. These extremely high doping levels result in increased leakage and reduced carrier mobility. Thus, the expected improved performance attributed to a shorter channel is negated by the lower carrier mobility and higher leakage attributed to the higher doping.

Figure 2:
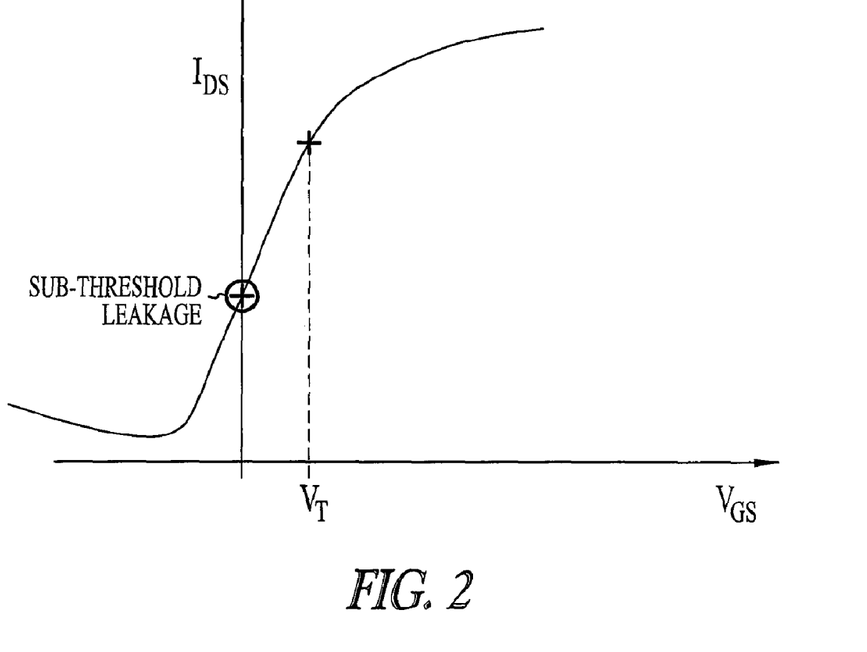
FIG. 2 illustrates sub-threshold leakage in a conventional silicon MOSFET.

Leakage current is a significant issue in low voltage and lower power battery-operated CMOS circuits and systems, and particularly in DRAM circuits. The threshold voltage magnitudes are small to achieve significant overdrive and reasonable switching speeds. However, as illustrated in FIG. 2, the small threshold results in a relatively large sub-threshold leakage current.

Some proposed designs to address this problem use transistors with ultra-thin bodies, or transistors where the surface space charge region scales as other transistor dimensions scale down. Dual-gated or double-gated transistor structures also have been proposed to scale down transistors. As commonly used in the industry, "dual-gate" refers to a transistor with a front gate and a back gate which can be driven with separate and independent voltages, and "double-gated" refers to structures where both gates are driven when the same potential. An example of a double-gated device structure is the FinFET. "TriGate" structures and surrounding gate structures have also been proposed. In the "TriGate" structure, the gate is on three sides of the channel. In the surrounding gate structure, the gate surrounds or encircles the transistor channel. The surrounding gate structure provides desirable control over the transistor channel, but the structure has been difficult to realize in practice.

Figure 3:
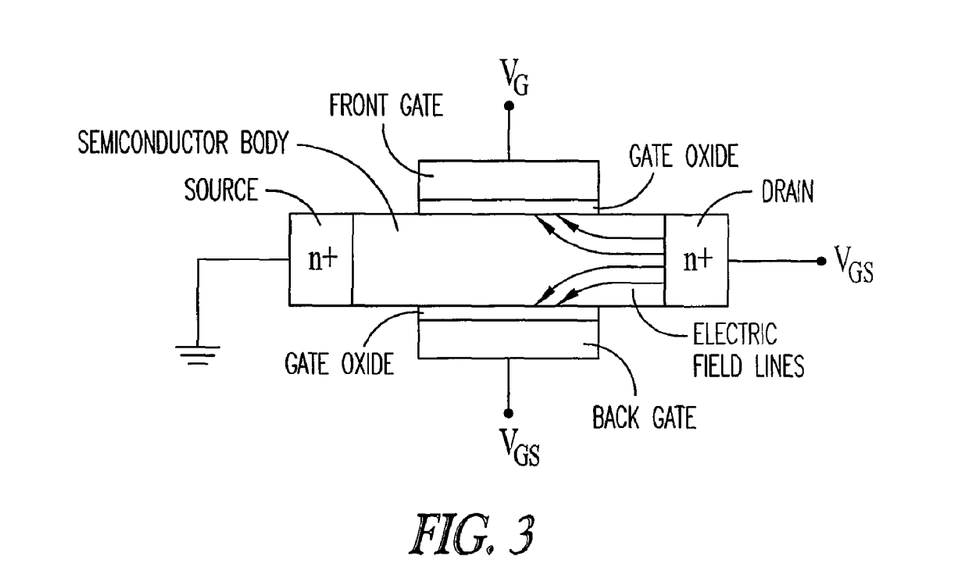
FIG. 3 illustrates a dual-gated MOSFET with a drain, a source, front and back gates separated from a semiconductor body by gate insulators, and an electric field generated by the drain.
Figure 4:
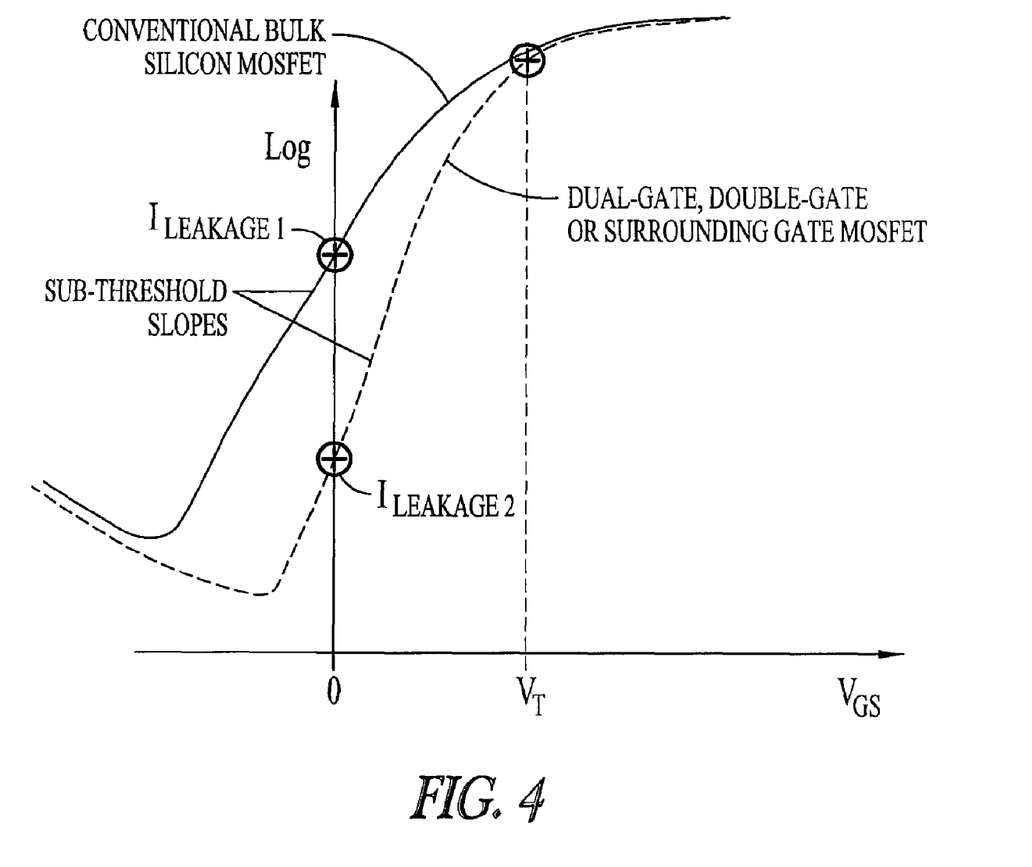
FIG. 4 generally illustrates the improved sub-threshold characteristics of dual gate, double-gate, or surrounding gate MOSFETs in comparison to the sub-threshold characteristics of conventional bulk silicon MOSFETs.

FIG. 3 illustrates a dual-gated MOSFET with a drain, a source, and front and back gates separated from a semiconductor body by gate insulators, and also illustrates an electric field generated by the drain. Some characteristics of the dual-gated and/or double-gated MOSFET are better than the conventional bulk silicon MOSFETs, because compared to a single gate the two gates better screen the electric field generated by the drain electrode from the source-end of the channel. The surrounding gate further screens the electric field generated by the drain electrode from the source. Thus, sub-threshold leakage current characteristics are improved, because the sub-threshold current is reduced more quickly as the gate voltage is reduced when the dual-gate and/or double gate MOSFET turns off. FIG. 4 generally illustrates the improved sub-threshold characteristics of dual gate, double-gate, or surrounding gate MOSFETs in comparison to the sub-threshold characteristics of conventional bulk silicon MOSFETs.

Advances have been made in the growth of II-V compound semiconductor nanowires and in the fabrication of III-V compound semiconductor nanowire transistors. The growth of the II-V compound semiconductor transistors is achieved by vapor-liquid-solid (VLS) epitaxial growth of vertical nanowires on gold dots. Silicon nanowire transistors have been previously described by vapor phase epitaxial growth through a hole or by solid phase epitaxial growth over a polysilicon DRAM capacitor plate to make a polycrystalline nanowire transistor.

SUMMARY

An embodiment of the present subject matter provides nanowire transistors from amorphous semiconductor nanorods that are recrystallized on the surface of a semiconductor wafer. The silicon nanorods are formed with dimensions smaller than lithographic dimensions by a sidewall spacer technique. The recrystallization of the amorphous nanorods uses solid phase epitaxial growth. The resulting nanowires can be used as the body regions of transistors where both the thickness of the body of the transistor and channel length have dimensions smaller than lithographic dimensions. The nanowire transistors have a wraparound gate. Various nanowire transistor embodiments use silicon nanowires.

One aspect of the present subject matter relates to a method for forming a transistor. According to an embodiment of the method, a pillar of amorphous semiconductor material is formed on a crystalline substrate, and a solid phase epitaxy process is performed to crystallize the amorphous semiconductor material using the crystalline substrate to seed the crystalline growth. The pillar has a sublithographic thickness. A transistor body is formed in the crystallized semiconductor pillar between a first source/drain region and a second source/drain region. A surrounding gate insulator is formed around the semiconductor pillar, and a surrounding gate is formed around and separated from the semiconductor pillar by the surrounding gate insulator.

An aspect relates to a transistor. A transistor embodiment includes a crystalline substrate, a first source/drain region formed in the crystalline substrate, and a crystalline semiconductor pillar formed on the substrate in contact with the first source/drain region. The transistor includes a second source/drain region formed in a top portion of the pillar, a gate insulator formed around the pillar, and a surrounding gate formed around and separated from the pillar by the gate insulator. The pillar has cross-section dimensions less than a minimum feature size.

These and other aspects, embodiments, advantages, and features will become apparent from the following description of the present subject matter and the referenced drawings.

DETAILED DESCRIPTION

The following detailed description refers to the accompanying drawings which show, by way of illustration, specific aspects and embodiments in which the present subject matter may be practiced. These embodiments are described in sufficient detail to enable those skilled in the art to practice the present subject matter. The various embodiments of the present subject matter are not necessarily mutually exclusive as aspects of one embodiment can be combined with aspects of another embodiment. Other embodiments may be utilized and structural, logical, and electrical changes may be made without departing from the scope of the present subject matter. In the following description, the terms "wafer" and "substrate" are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

The following discussion refers to silicon nanowire transistor embodiments. Those of ordinary skill in the art will understand, upon reading and comprehending this disclosure, how to use the teaching contained herein to form nanowire transistors using other semiconductors.

Figure 5A:
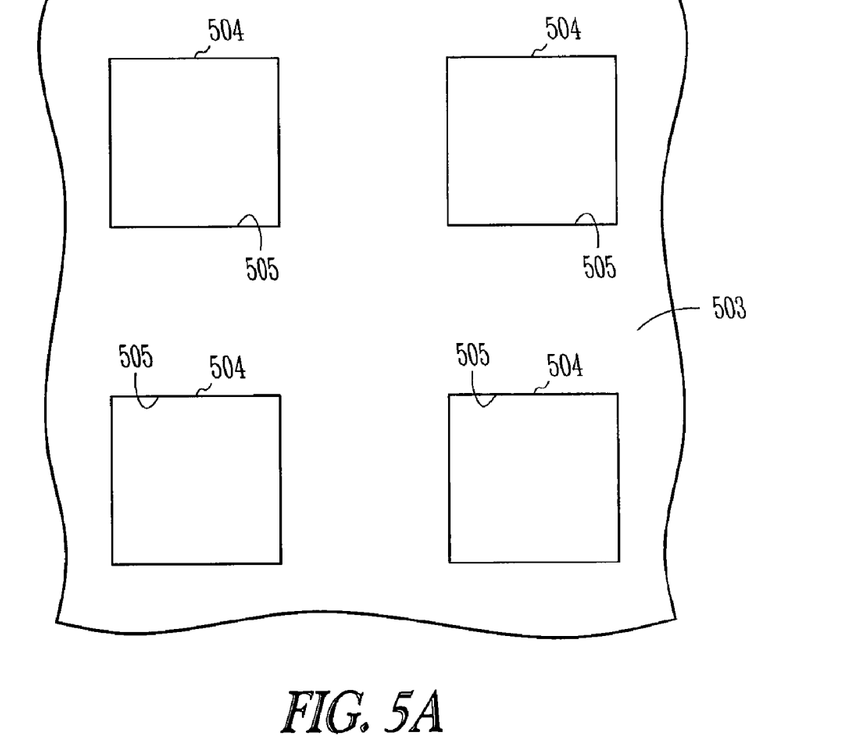
FIGS. 5A-5H illustrate an embodiment of a process to form crystalline nanorods with surrounding gates.

FIGS. 5A-5H illustrate an embodiment of a process to form crystalline nanorods with surrounding gates. FIG. 5A illustrates a first layer 503 on a substrate 504, with holes 505 formed in the first layer. The first layer is able to be etched to define the holes within the layer. According to various embodiments, the holes 505 are formed in a silicon nitride layer 503 on a silicon substrate 504, such that the holes extend through the silicon nitride layer to the silicon substrate. In the illustrated embodiment, the holes are formed with dimensions corresponding to the minimum feature size. The center of each hole corresponds to the desired location of the nanowire transistor. An array of nanowire transistors can have a center-to-center spacing between rows and columns of 2F.

A layer of oxide is provided to cover the first layer after the holes have been etched therein. Various embodiments form a silicon oxide over the silicon nitride layer. Some embodiments deposit the silicon oxide by a chemical vapor deposition (CVD) process.

Figure 5B:
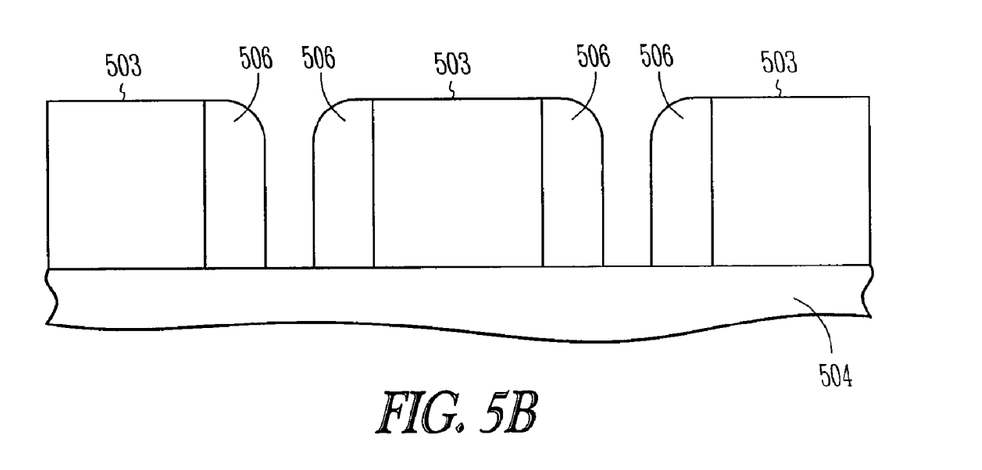

FIG. 5B illustrates the structure after the oxide is directionally etched to leave oxide sidewalls 506 on the sides of the hole, which function to reduce the dimensions of the resulting hole, and the resulting structure is planarized. In 100 nm technology, for example, the oxide sidewalls reduce the dimensions of the hole to about 30 nm. In this example, the thickness of the body region for the transistor will be on the order of ⅓ of the feature size. Some embodiments planarize the structure using a chemical mechanical polishing (CMP) process.

Figure 5C:
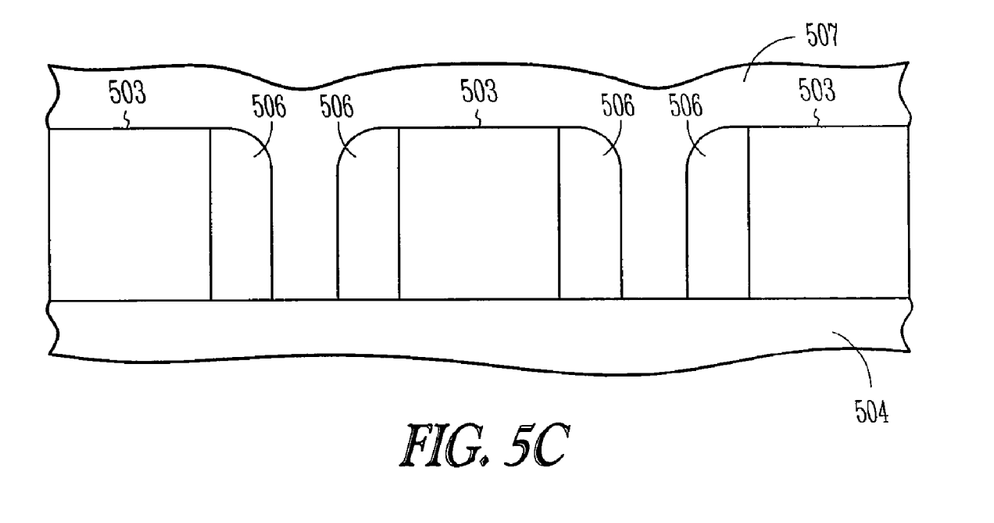
Figure 5D:
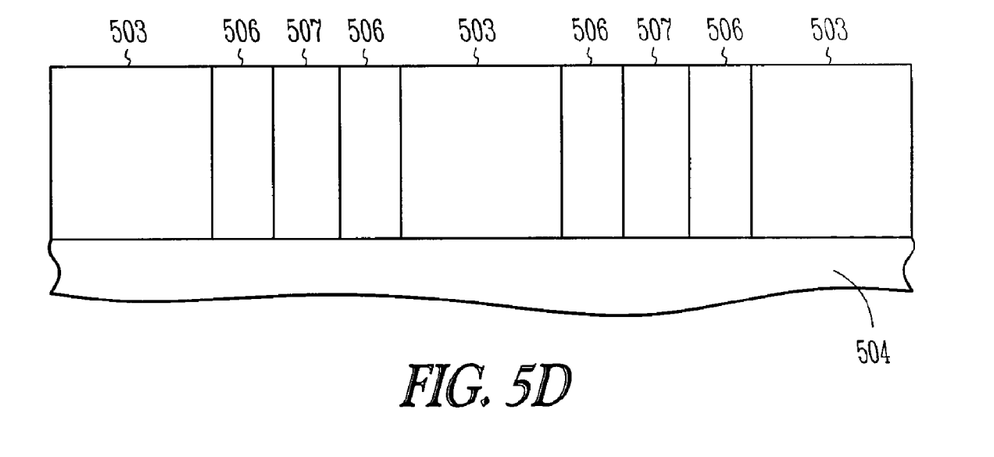

FIG. 5C illustrates a thick layer of an amorphous semiconductor material 507 formed over the resulting structure. The amorphous material fills the hole defined by the sidewalls 506. Various embodiments deposit amorphous silicon as the amorphous material. FIG. 5D illustrates the resulting structure after it is planarized, such as by CMP, to leave amorphous semiconductor material only in the holes.

Figure 5E:
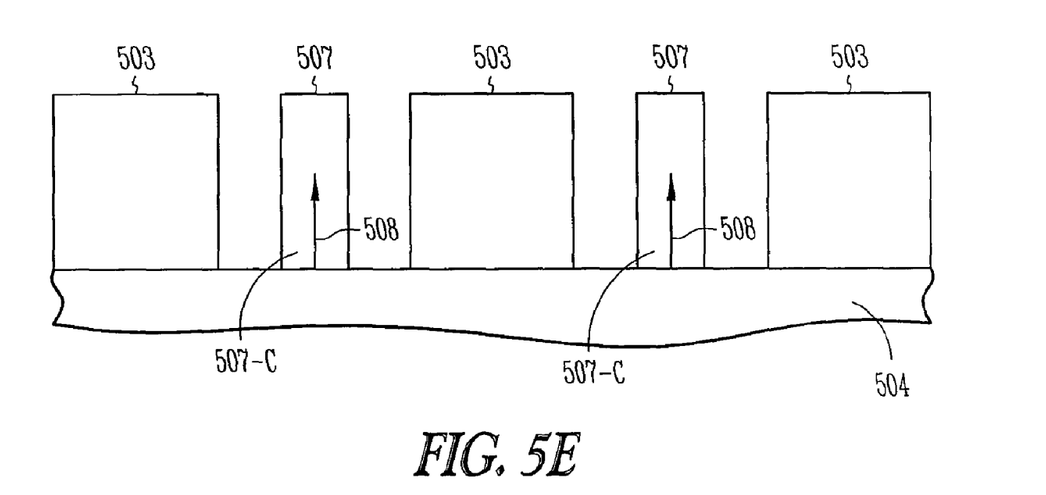

FIG. 5E illustrates the resulting structure after the sidewalls (e.g. silicon oxide sidewalls) are removed. The structure is heat treated to crystallize the amorphous semiconductor 507 (e.g. a-silicon) into crystalline nanorods (represented as 507-C) using a process known as solid phase epitaxy (SPE). The amorphous semiconductor pillar 507 is in contact with the semiconductor wafer (e.g. silicon wafer), and crystal growth in the amorphous semiconductor pillar is seeded by the crystals in the wafer. The crystal formation from the SPE process is illustrated by the arrows 508 in FIG. 5E.

Figure 5F:
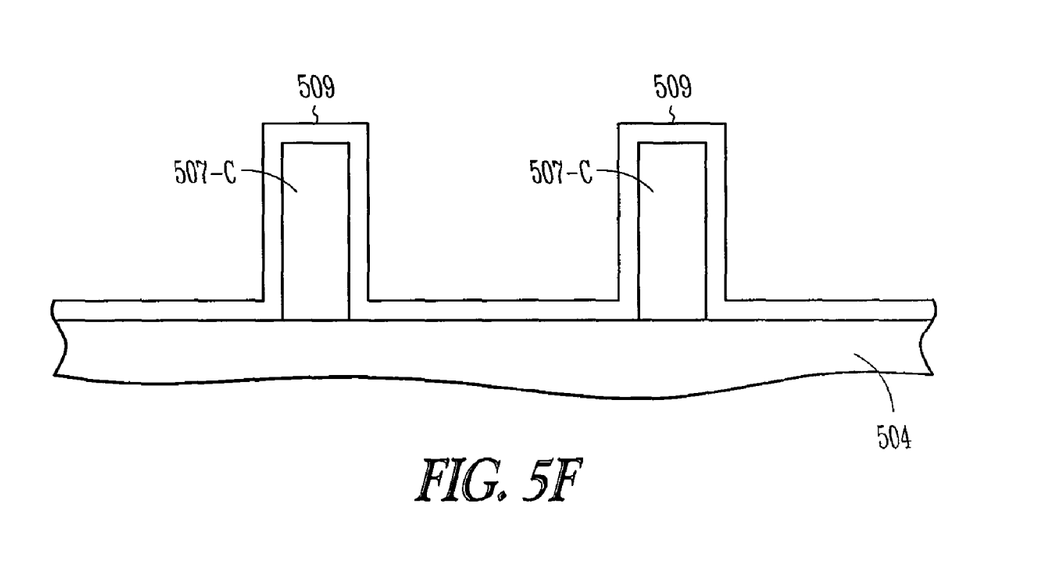

FIG. 5F illustrates the structure after the first layer (e.g. silicon nitride) is removed, leaving crystalline nanorods 507-C extending away from the substrate surface, and after a gate insulator 509 is formed over the resulting structure. An embodiment forms the gate insulator by a thermal oxidation process. Thus, for an embodiment in which the wafer is a silicon wafer and the nanorods are crystalline silicon nanorods, the gate insulator is a silicon oxide. Other gate insulators, such as high K insulators, may be used.

Figure 5G:
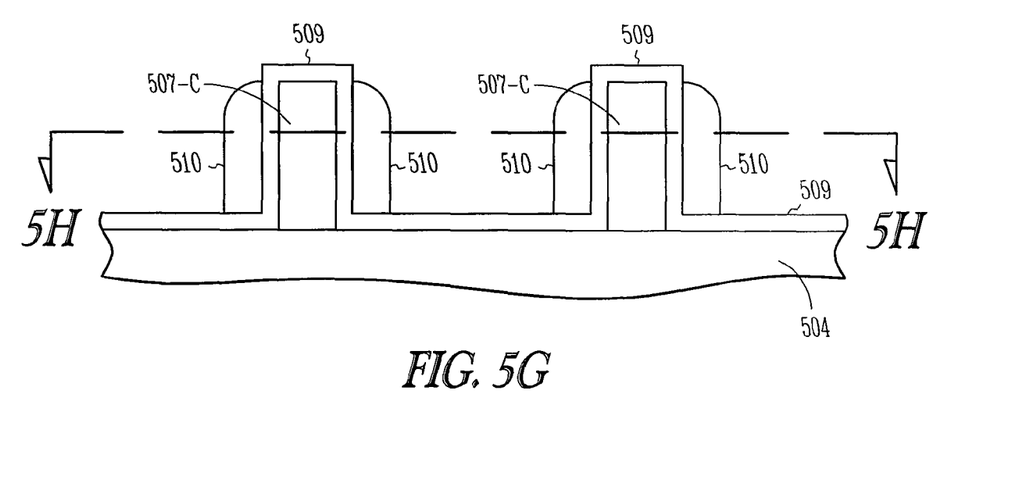
Figure 5H:
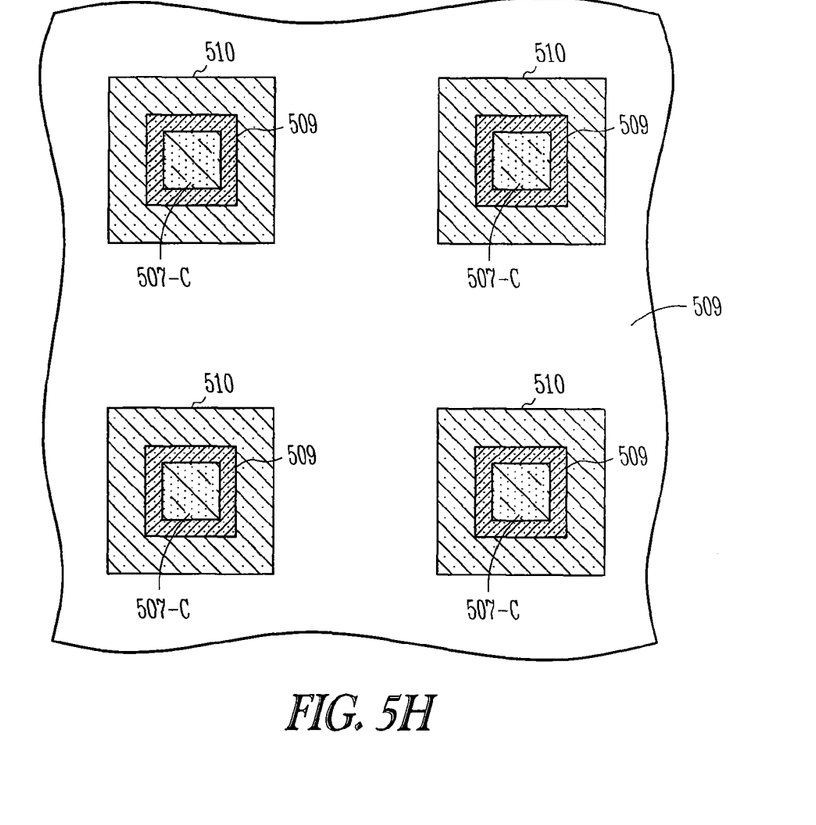

FIG. 5G illustrates a side view and FIG. 5H illustrates a cross-section view along 5H-5H of FIG. 5G view of the structure after a gate material 510 is formed on the sidewalls of the crystalline nanorods 507-C. An embodiment deposits the gate material and etches the resulting structure to leave the gate material only on the sidewalls of the nanorods. Polysilicon is used as the gate material, according to various embodiments. The height of the pillars, which determines the channel length of the transistors, can be less than the minimum lithographic dimensions. Various embodiments provide a channel length on the order of approximately 100 nm. These nanorods with wraparound gates can be used to form nanowire transistors with surrounding or wraparound gates. The process continues in FIGS. 6A-6C for some embodiments of standalone transistors, and continued in FIGS. 7A-7C for some embodiments of transistor arrays.

Figure 6A:
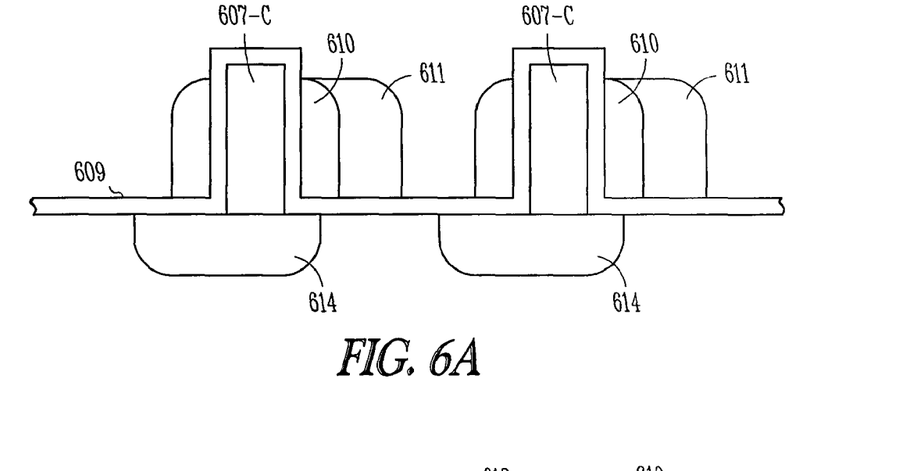
FIGS. 6A-6C illustrate an embodiment of a process to form isolated transistors with source, drain and gate contacts, using the nanorods with wraparound gates illustrated in FIGS. 5A-5H.
Figure 6B:
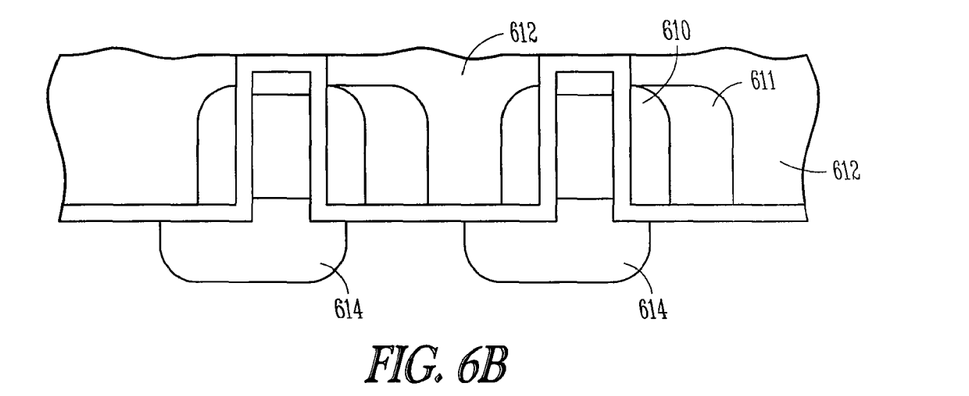
Figure 6C:
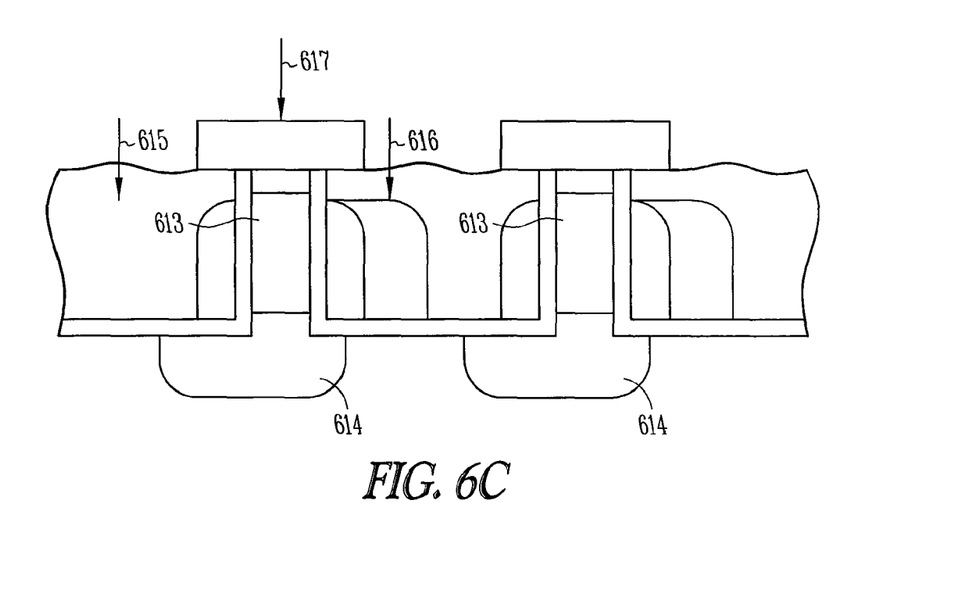

FIGS. 6A-6C illustrate an embodiment of a process to form isolated transistors with source, drain and gate contacts, using the nanorods with wraparound gates illustrated in FIGS. 5A-5H. The illustrated structure includes a crystalline nanorod 607-C, a gate insulator 609, and a surrounding gate 610. Gate contacts 611 for the wraparound gates are patterned. Various embodiments deposit polysilicon to function as gate contacts for the wraparound gates. Both the wraparound gate and the gate contact, also referred to as a gate pad, are recessed below the top of the nanowire. A directional etching process may be used to recess the wraparound gate and the gate pad. As illustrated in FIG. 6B, the resulting structure is filled with an insulator fill (e.g. oxide) 612 and planarized to the top of the nanowires. The top of the nanowires are exposed by removing the gate insulator from the top of the nanowire. For example, an etch can be used to remove silicon oxide from the top of the nanowire. The top of the nanowires can be doped and contact areas defined. The doped top portion 613 of the nanowires can function as a drain region. The substrate is appropriately doped to diffuse under the crystalline nanorod, and extend up into a bottom portion of the nanorod. This doped region can function as a source region. This doped region 614 also extends to a contact area. The doped region can be formed before the first layer is deposited and holes formed therein. The dopant can also be implanted and diffused before the surrounding gate is formed. Appropriate doping can be provided to provide NMOS or PMOS transistors. As illustrated in FIG. 6C, a contact 615 can be etched to the buried source, a contact 616 can be etched to the buried gate pad, and a contact 617 can also be formed for the drain. Those of ordinary skill in the art will understand, upon reading and comprehending this disclosure, that other stand alone transistor designs may be used.

Figure 7A:
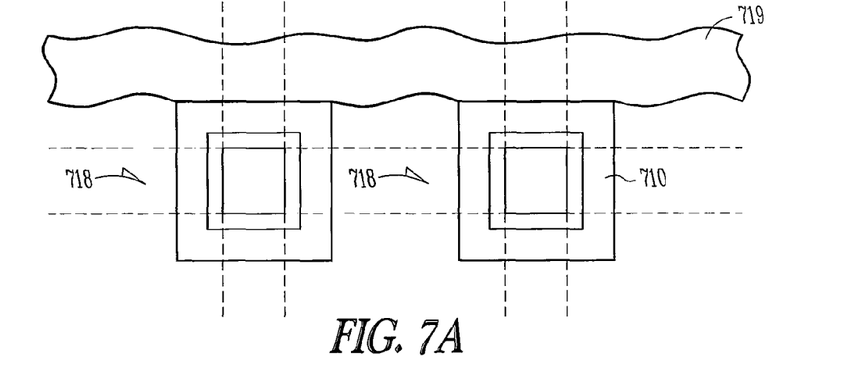
FIGS. 7A-7C illustrate an embodiment of a process to form an array of transistors, using the nanorods with wraparound gates illustrated in FIGS. 5A-5H.
Figure 7B:
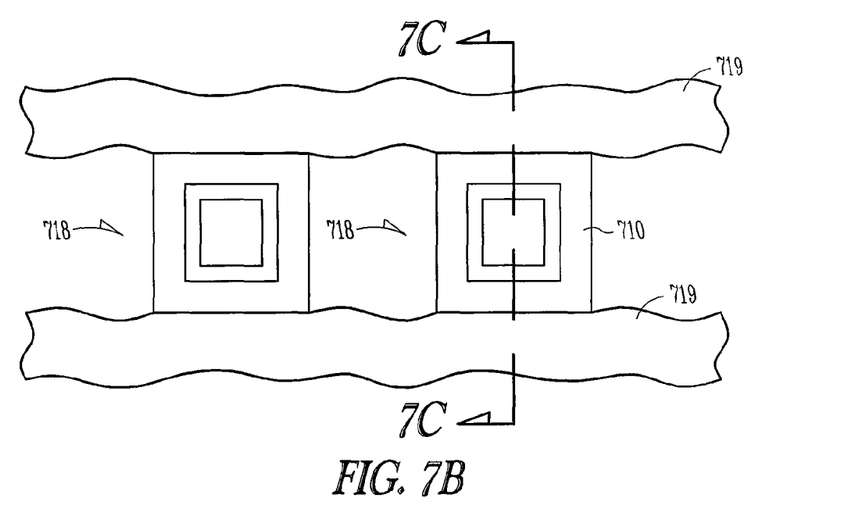
Figure 7C:
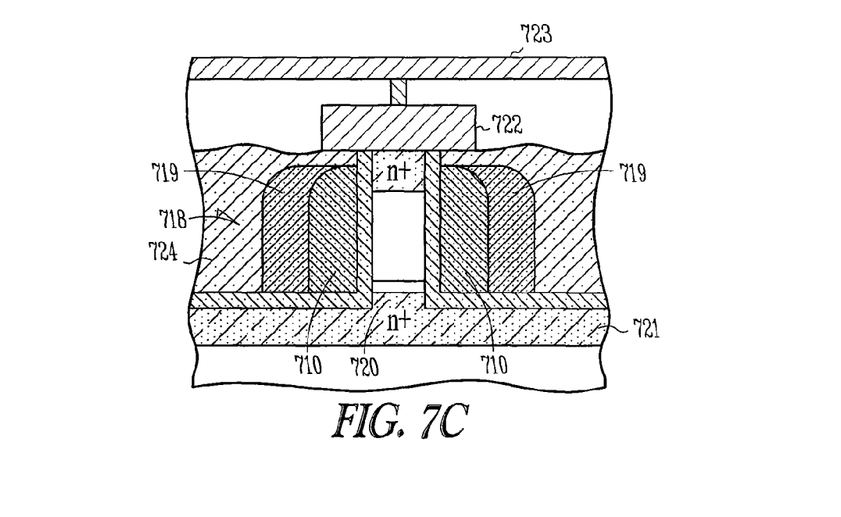

FIGS. 7A-7C illustrate an embodiment of a process to form an array of transistors, using the nanorods with wraparound gates illustrated in FIGS. 5A-5H. FIG. 7A illustrates a top view of adjacent transistors in a row of an embodiment of a transistor array. According to the illustrated embodiment, one word line 719 is formed adjacent to one row of transistors, such that the wraparound gates 710 of each transistor 718 in the row are in contact with the adjacent word line. FIG. 7B illustrates a top view of adjacent transistors in a row of another embodiment of a transistor array. According to various embodiments, polysilicon or gate material can be used for the gate wiring, a buried doped region can form a source region 720 and the source wiring 721, and metal contacts 722 and metal used for the drain wiring 723. In some embodiments, the nanowire structure with only wraparound gates is then backfilled with oxide and patterned and etched to leave oxide 724 between the pillars in one direction and expose the wrap around gates on the side. Polysilicon can be deposited and directionally etched to leave only on the sidewalls of the oxide blocks and exposed gate sides. As described with respect to FIG. 6C, the wraparound gates can be further directionally etched to recess them below the top of the nanowire transistors. This will form the gate contacts and wiring. The structure can be planarized and backfilled with oxide and the top of the nanowires doped and contacted for the drain wiring using conventional techniques. Those of ordinary skill in the art will understand, upon reading and comprehending this disclosure, that other transistor array designs may be used.

Figure 8:
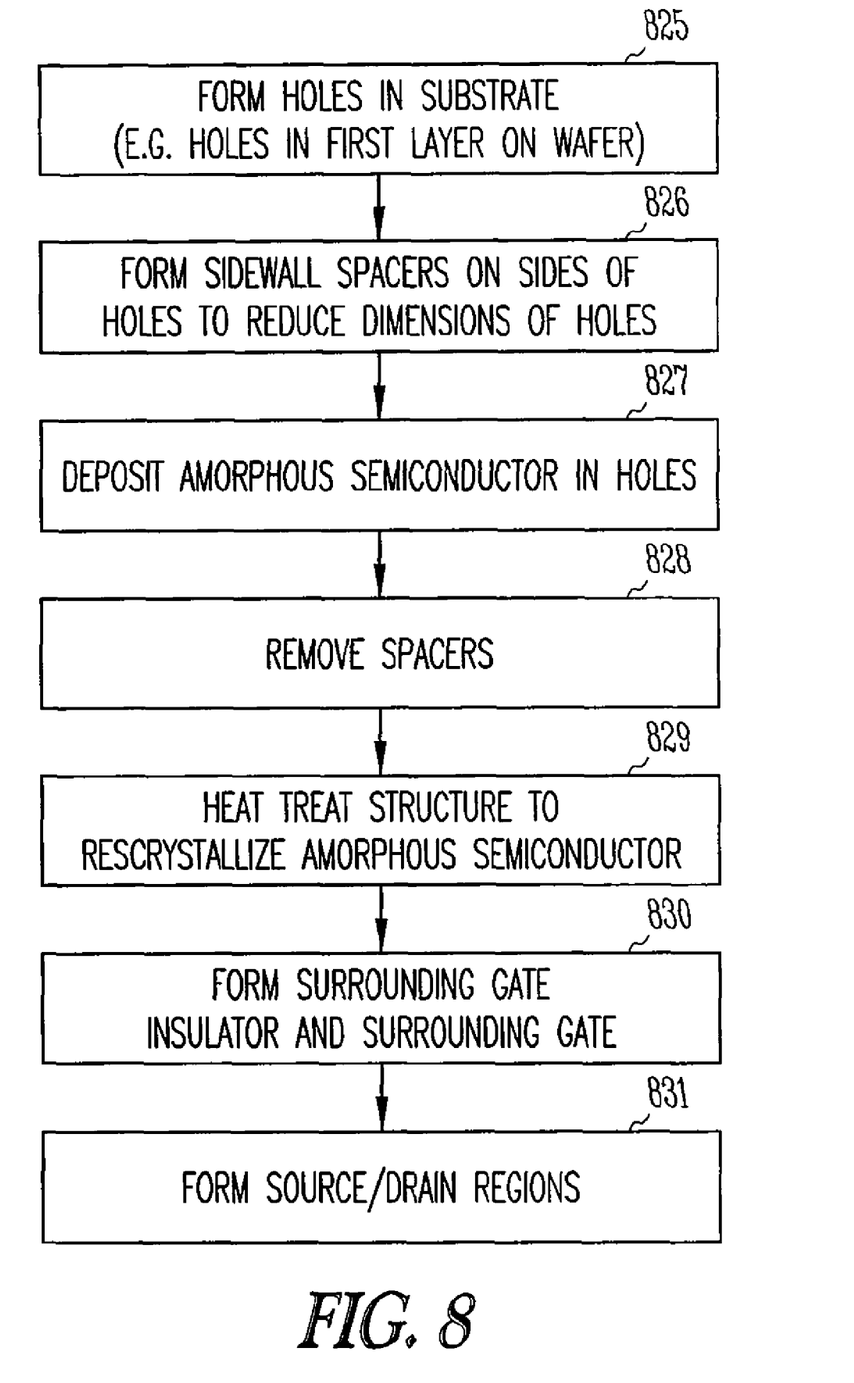
FIG. 8 illustrates a flow diagram for forming a nanowire transistor with surrounding gates, according to various embodiments of the present subject matter.

FIG. 8 illustrates a flow diagram for forming a nanowire transistor with surrounding gates, according to various embodiments of the present subject matter. At 825, holes are formed in a substrate. For example, the substrate can include a first layer on a wafer, such as a layer of silicon nitride on a silicon wafer, and the holes are formed in the first layer to expose the wafer. The holes are defined by walls formed by the first layer. At 826, spacer sidewalls are formed within the holes against the walls formed by the first layer to effectively reduce the dimensions of the holes. An example of a spacer sidewall is silicon oxide. At 827, the holes are filled by an amorphous semiconductor (e.g. a-silicon). The spacer sidewalls are removed at 828, leaving pillars of amorphous semiconductor extending away from the wafer. The resulting structure is heat-treated or annealed at 829 to recrystallize the amorphous semiconductor, using the wafer to seed the crystalline growth. The recrystallization process is referred to as solid phase epitaxy (SPE). The resulting structure includes crystalline nanowires extending away from the wafer. At 830, a surrounding gate insulator and a surrounding gate are formed around the crystalline nanowires. Source/drain regions are formed at 831. The bottom of the nanowire is doped to form a first source/drain region, and the top of the nanowire is doped to form a second source/drain region. The first source/drain region can be formed by doping the substrate before depositing the first layer and patterning and etching the holes. The first source/drain can also be formed by implanting dopants adjacent to the nanorod before the gate is formed. These implanted dopants are capable of diffusing completely under the nanorod because the nanorods are very thin. This doping can be performed after the first layer is removed off of the substrate.

Figure 9:
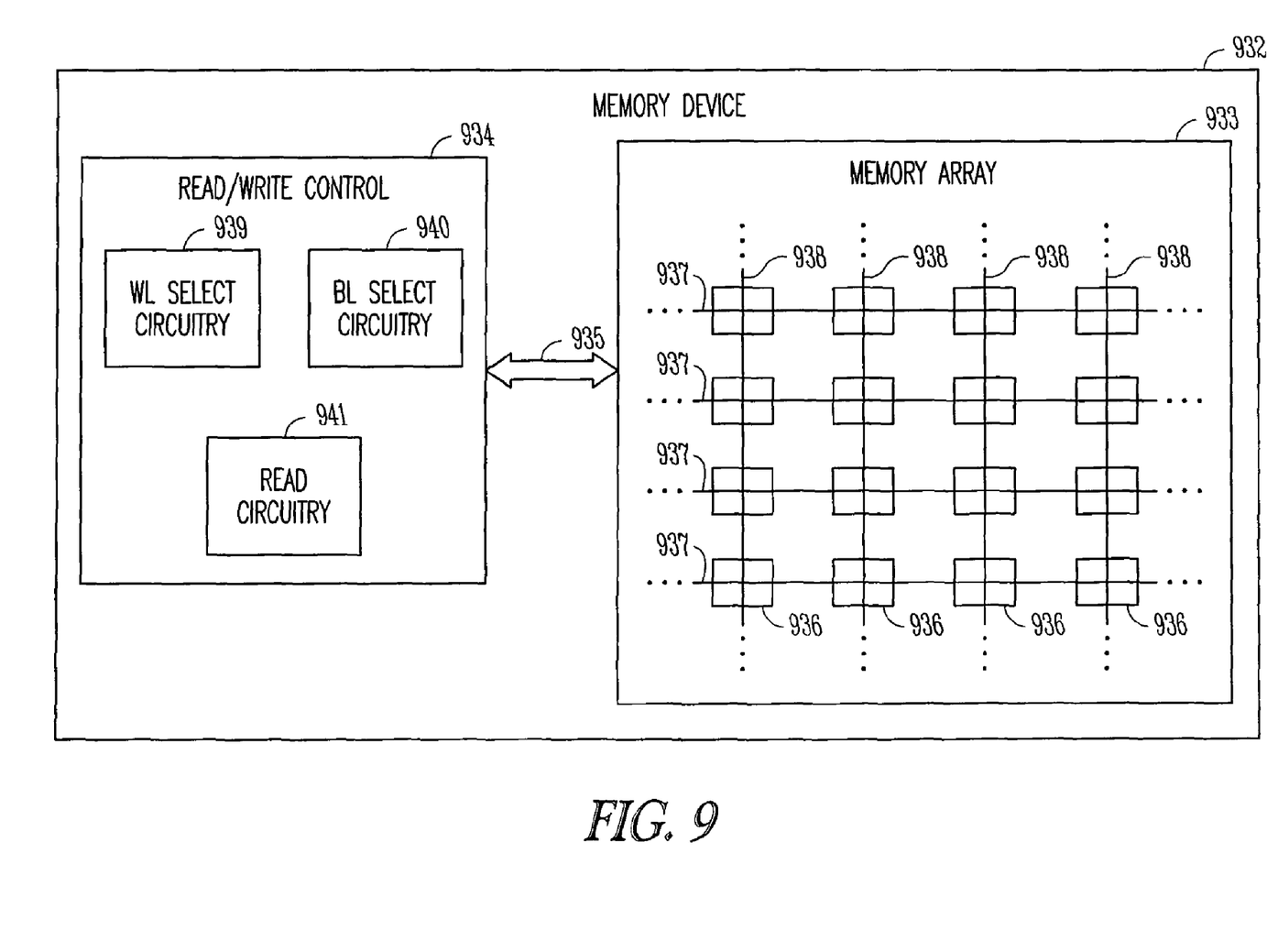
FIG. 9 is a simplified block diagram of a high-level organization of various embodiments of a memory device according to various embodiments of the present subject matter.

FIG. 9 is a simplified block diagram of a high-level organization of various embodiments of a memory device according to various embodiments of the present subject matter. The illustrated memory device 932 includes a memory array 933 and read/write control circuitry 934 to perform operations on the memory array via communication line(s) or channel(s) 935. The illustrated memory device 932 may be a memory card or a memory module such as a single inline memory module (SIMM) and dual inline memory module (DIMM). One of ordinary skill in the art will understand, upon reading and comprehending this disclosure, that semiconductor components in the memory array and/or the control circuitry are able to be fabricated using the nanowire transistors with surrounding gates, as described above. The structure and fabrication methods for these devices have been described above.

The memory array 933 includes a number of memory cells 936. The memory cells in the array are arranged in rows and columns. In various embodiments, word lines 937 connect the memory cells in the rows, and bit lines 938 connect the memory cells in the columns. The read/write control circuitry 934 includes word line select circuitry 939 which functions to select a desired row, bit line select circuitry 940 which functions to select a desired column, and read circuitry 941 which functions to detect a memory state for a selected memory cell in the memory array 933.

Figure 10:
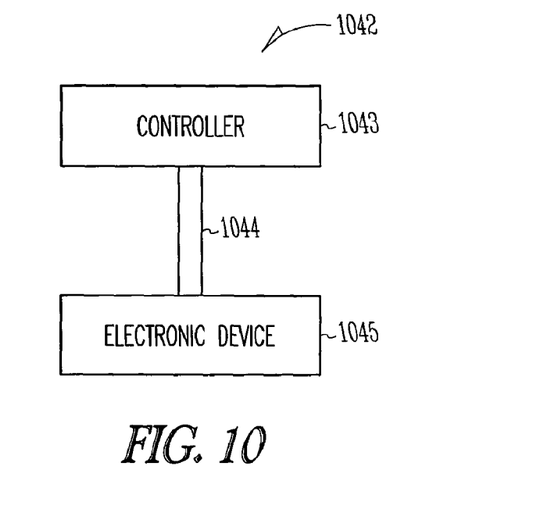
FIG. 10 illustrates a diagram for an electronic system having nanowire transistors, according to various embodiments.

FIG. 10 illustrates a diagram for an electronic system 1042 having one or more nanowire transistors with surrounding gates, according to various embodiments. The electronic system includes a controller 1043, a bus 1044, and an electronic device 1045, where the bus provides communication channels between the controller and the electronic device. In various embodiments, the controller and/or electronic device include nanowire transistors as previously discussed herein. The illustrated electronic system may include, but is not limited to, information handling devices, wireless systems, telecommunication systems, fiber optic systems, electro-optic systems, and computers.

Figure 11:
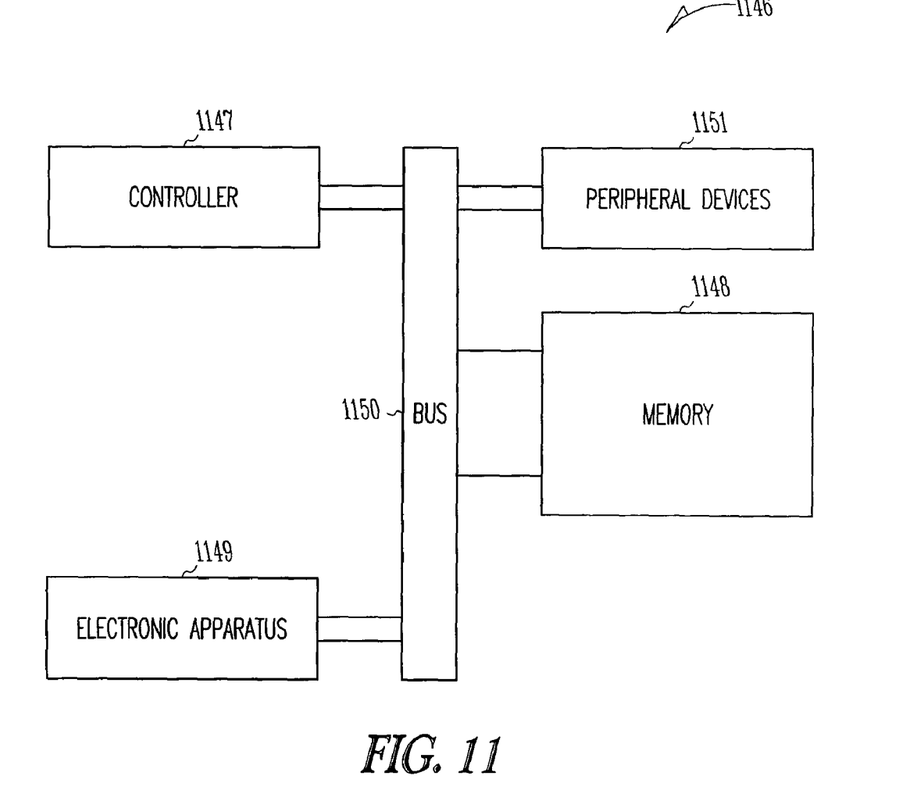
FIG. 11 depicts a diagram of an embodiment of a system having a controller and a memory.

FIG. 11 depicts a diagram of an embodiment of a system 1146 having a controller 1147 and a memory 1148. The controller and/or memory may include nanowire transistors. The illustrated system also includes an electronic apparatus 1149 and a bus 1150 to provide communication channel(s) between the controller and the electronic apparatus, and between the controller and the memory. The bus may include an address, a data bus, and a control bus, each independently configured; or may use common communication channels to provide address, data, and/or control, the use of which is regulated by the controller. In an embodiment, the electronic apparatus 1149 may be additional memory configured similar to memory 1148. An embodiment may include a peripheral device or devices 1151 coupled to the bus. Peripheral devices may include displays, additional storage memory, or other control devices that may operate in conjunction with the controller and/or the memory. In an embodiment, the controller is a processor. Any of the controller, the memory, the electronic apparatus, and the peripheral devices may include nanowire transistors. The system may include, but is not limited to, information handling devices, telecommunication systems, and computers. Applications containing nanowire transistors as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

The memory may be realized as a memory device containing nanowire transistors according to various embodiments. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM). Various emerging memory technologies are capable of using nanowire transistors.

This disclosure includes several processes, circuit diagrams, and structures. The present subject matter is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing and understanding the above description. The scope of the present subject matter should be determined with reference to the appended claims, along with the full scope of equivalents to which such claims are entitled.

What is claimed is:

1. A method, comprising:
    forming a pillar of amorphous semiconductor material on a crystalline substrate, wherein the pillar has a cross-sectional dimension less than a minimum feature size;
    crystallizing the pillar using the crystalline substrate to seed crystalline growth;
    forming a gate insulator adjacent to the pillar; and
    forming a gate separated from the pillar by the gate insulator.

2. The method of claim 1, wherein forming the pillar of amorphous semiconductor material includes:
    forming a first layer on the substrate;
    forming a hole of a size corresponding to the minimum feature size extending through the first layer to the substrate;
    reducing a cross-sectional dimension of the hole, including forming sidewalls in contact with sides of the first layer that define the hole;
    filling the hole with the amorphous semiconductor material, wherein the amorphous semiconductor material is in contact with the substrate; and
    removing the first layer and the sidewalls.

3. The method of claim 1, further comprising forming a first source/drain region and a second source/drain region to provide a vertically-oriented channel in the crystallized pillar.

4. The method of claim 1, wherein forming the gate insulator includes forming a surrounding gate insulator around the pillar, and forming the gate includes forming a surrounding gate around the pillar and separated from the pillar by the surrounding gate insulator.

5. The method of claim 4, wherein forming the surrounding gate includes forming the surrounding gate with a top surface below a top surface of the pillar.

6. The method of claim 4, wherein forming the surrounding gate insulator includes oxidizing the semiconductor pillar.

7. The method of claim 1, wherein:
    forming the pillar includes forming the pillar with a footprint on the substrate;
    the footprint is less than a minimum feature size in a first direction and less than the minimum feature size in a second direction; and
    the second direction is orthogonal to the first direction.

8. The method of claim 1, wherein the cross-sectional dimension is on the order of 30 nm.

9. The method of claim 1, wherein the cross-sectional dimension is on the order of ⅓ of the minimum feature size.

10. A method, comprising:
    forming a pillar of amorphous silicon on a crystalline silicon substrate, wherein a footprint of the pillar is less than a minimum feature size in a first direction and less than the minimum feature size in a second direction, and wherein the second direction is orthogonal to the first direction;

crystallizing the pillar using the substrate to seed crystalline growth to provide a pillar of crystalline silicon;
forming a surrounding gate insulator around the pillar; and
forming a surrounding gate around the pillar and separated from the pillar by the surrounding gate insulator.

11. The method of claim 10, wherein forming the surrounding gate includes oxidizing the pillar of crystalline silicon.

12. The method of claim 10, wherein forming the pillar of amorphous silicon includes:
forming a first layer on the substrate;
forming a hole of a size corresponding to the minimum feature size through the first layer to the substrate;
reducing a cross-sectional dimension of the hole, including forming sidewalls in contact with sides of the first layer that define the hole;
filling the hole with the amorphous silicon, wherein the amorphous silicon is in contact with the substrate; and
removing the first layer and the sidewalls.

13. The method of claim 12, wherein forming the first layer includes forming a layer of silicon nitride.

14. The method of claim 12, wherein forming sidewalls includes forming silicon oxide sidewall spacers on the sides of the first layer that define the hole.

15. The method of claim 12, further comprising forming a first source/drain region and a second source/drain region to provide a vertically-oriented channel in the pillar of crystalline silicon.

16. The method of claim 10, further comprising:
forming at least one buried source conductor in the silicon wafer, wherein the hole is formed over the buried source conductor;
forming at least one gate line in contact with the surrounding gate; and
forming a second source/drain diffusion region in a top portion of the pillar.

17. The method of claim 10, wherein the footprint of the pillar is on the order of 30 nm in both the first and second directions.

18. The method of claim 10, wherein the footprint of the pillar is on the order of ⅓ the minimum feature size in both the first and second directions.

19. A method, comprising:
forming a first layer on a crystalline semiconductor substrate;
forming a hole through the first layer to the substrate, wherein the hole has a size corresponding to a minimum feature size;
forming sidewalls in contact with sides of the first layer that define the hole;
filling the hole with an amorphous semiconductor, wherein the amorphous semiconductor is in contact with the substrate;
removing the first layer and the sidewalls to leave a pillar of amorphous semiconductor extending from the crystalline semiconductor substrate; and
crystallizing the pillar of amorphous semiconductor using the crystalline semiconductor substrate to seed crystalline growth.

20. The method of claim 19, further comprising:
forming a gate insulator adjacent to the pillar; and
forming a gate separated from the pillar by the gate insulator.

21. The method of claim 19, further comprising:
forming a surrounding gate insulator around the pillar; and
forming a surrounding gate around the pillar and separated from the pillar by the surrounding gate insulator.

22. A method, comprising:
forming a silicon nitride layer on a silicon wafer;
etching a hole in the silicon nitride layer, the hole having a size corresponding to a minimum feature size and extending through the silicon nitride to the silicon wafer;
forming silicon oxide sidewall spacers within the hole in contact with the silicon nitride;
filling the hole with an amorphous silicon, the amorphous silicon being in contact with the silicon wafer;
removing the silicon oxide sidewall spacers to leave an amorphous silicon pillar in contact with and extending from the wafer;
crystallizing the silicon pillar using the wafer to seed crystalline growth to form a crystalline silicon pillar;
removing the silicon nitride from the wafer;
forming an insulator layer on the wafer and the silicon pillar; and
forming a surrounding gate around and separated from the silicon pillar by the surrounding gate insulator.

23. The method of claim 22, wherein forming the insulator layer includes oxidizing the wafer and the silicon pillar.

24. The method of claim 22, further comprising:
forming a first source/drain diffusion region in the wafer; and
forming a second source/drain diffusion region in a top portion of the pillar.

25. The method of claim 22, further comprising:
forming at least one buried source conductor in the silicon wafer, wherein the hole is formed over the buried source conductor;
forming at least one gate line in contact with the surrounding gate; and
forming a second source/drain diffusion region in a top portion of the pillar.

* * * * *